United States Patent
Teraji et al.

(10) Patent No.: US 8,338,834 B2
(45) Date of Patent: Dec. 25, 2012

(54) DIAMOND SEMICONDUCTOR DEVICE

(75) Inventors: Tokuyuki Teraji, Ibaraki (JP); Satoshi Koizumi, Ibaraki (JP); Yasuo Koide, Ibaraki (JP)

(73) Assignee: National Institute for Materials Science, Ibaraki (JP)

( * ) Notice: Subject to any disclaimer, the term of this patent is extended or adjusted under 35 U.S.C. 154(b) by 441 days.

(21) Appl. No.: 12/667,112

(22) PCT Filed: Jul. 3, 2008

(86) PCT No.: PCT/JP2008/062111
§ 371 (c)(1),
(2), (4) Date: Feb. 19, 2010

(87) PCT Pub. No.: WO2009/005134
PCT Pub. Date: Jan. 8, 2009

(65) Prior Publication Data
US 2010/0289031 A1 Nov. 18, 2010

(30) Foreign Application Priority Data
Jul. 4, 2007 (JP) .................... 2007-175702

(51) Int. Cl.
*H01L 29/15* (2006.01)
(52) U.S. Cl. .............. 257/77; 257/64; 257/88; 257/103; 257/280
(58) Field of Classification Search ........................ None
See application file for complete search history.

(56) References Cited

U.S. PATENT DOCUMENTS
5,786,604 A * 7/1998 Yamashita et al. .............. 257/77

FOREIGN PATENT DOCUMENTS
| JP | 8-88235 | 4/1996 |
| JP | 8-139109 | 5/1996 |
| JP | 09-312300 | 12/1997 |
| JP | 2004-109020 | 4/2004 |

OTHER PUBLICATIONS
International Search Report issued Aug. 19, 2008 in International (PCT) Application No. PCT/JP2008/062111.

* cited by examiner

*Primary Examiner* — Kyoung Lee
(74) *Attorney, Agent, or Firm* — Wenderoth, Lind & Ponack, L.L.P.

(57) ABSTRACT

The diamond semiconductor device is a diamond semiconductor device where a pair of electrodes are fixed on a diamond substrate, and wherein at least one interface to the electrode on the surface of the diamond substrate has a hydrogen termination and at least the surface of the substrate between the pair of two electrodes is controlled to have a larger electric resistivity value than inside the substrate. Accordingly, a diamond semiconductor device can be realized, capable of attaining the device work stability, especially the device work stability in severe environments such as high temperature with exhibiting the function of the hydrogen termination thereof to the utmost extent.

3 Claims, 11 Drawing Sheets

DIAMOND SEMICONDUCTOR DEVICE

TECHNICAL FIELD

The present invention relates to a diamond semiconductor device utilizing a diamond substrate.

BACKGROUND ART

Regarding a semiconductor device utilizing a diamond substrate, JP-A 8-88235 discloses a field-effect transistor comprising, as provided on the surface of a hydrogen-terminated homoepitaxial diamond substrate of which the surface is terminated with hydrogen atoms, a source electrode and a drain electrode formed of gold, and a gate electrode made of aluminium. JP-A 2004-109020 discloses a p-channel field-effect transistor utilizing a liquid electrolyte as a gate and, as a channel, a diamond surface being comprised of a hydrogen termination and an oxygen termination as mixed therein through partial oxidation process of the hydrogen-terminated surface by ozone treatment.

In this type of semiconductor devices, the electric conductivity of the device shall be improved by terminating the interface between the electrode and the substrate by hydrogen, which makes it better the device performance.

However, in the conventional semiconductor devices, a hydrogen termination is formed also on the substrate surface where electrodes are not fabricated, leading to not only an electric conduction from the electrode to the diamond bulk via the diamond interface, but also electric conduction in the substrate surface between the electrodes, or that is, surface leakage current. The latter surface leakage current varies, greatly depending on the type and the amount of surface adsorbates, therefore destabilize the device performance. There is a problem that the performance destabilization is especially remarkable in severe environments such as high temperature device operation, etc.

DISCLOSURE OF THE INVENTION

An object of the present invention is to provide a diamond semiconductor device being able to extract the function of the hydrogen termination thereof to the utmost extent whereas preventing generation of surface leakage current thereby stabilizing the device performance, especially stabilizing the device performance in severe environments such as high temperature device operation, etc.

To attain the above-mentioned object, first, the diamond semiconductor device of the invention is a diamond semiconductor device comprising a pair of electrodes fixed on a diamond substrate, wherein at least one interface to the electrode on the surface of the diamond substrate has a hydrogen termination and at least the surface of the substrate between the pair of two electrodes is controlled to have a larger electric resistivity value than inside the substrate, that is, diamond bulk.

Secondly, in the above-mentioned first diamond semiconductor device, at least the substrate surface between the two electrodes is an oxygen-terminated surface.

Thirdly, in the above-mentioned first diamond semiconductor device, at least the substrate surface between the two electrodes is a non-termination surface.

The diamond semiconductor device of the invention is so designed that the electric resistivity value of the substrate surface between a pair of electrodes is larger than inside the substrate, that is, diamond bulk, and therefore, a leakage current does not flow in the substrate surface between the electrodes and the electric conductivity between the electrodes reflects the stable conductivity inside the diamond substrate. Accordingly, not only of course at ordinary temperature but also even in severe environments such as high temperature or the like, the device is free from electric conductivity change and therefore can secure stable performance intrinsic to diamond.

The interface between the electrode and the substrate is made to have a hydrogen termination existing therebetween thereby to improve the controllability of the electric conductivity at the interface between the electrode and the substrate; and by changing the work function of metal, or that is, by changing the type of metal, the electric conductivity thereof is controlled to attain the desired device characteristics. Concretely, the Schottky barrier to be formed at the interface between metal and diamond can be determined by suitably selecting the work function of metal, and therefore a rectifying Schottky electrode or a current-conductive ohmic electrode can be readily formed not requiring any specific treatment such as heat treatment or the like. Accordingly, for example, in case where a p-type diamond is used as the substrate, and when gold having a high work function is used as the electrode material, then the device may have ohmic characteristics, but when aluminium having a low work function is used, then the device may have Schottky characteristics.

With the diamond semiconductor device of the invention, in case where a rectifying diode is formed not having a hydrogen termination at the interface between the Schottky electrode and the substrate, the surface thereof may be irradiated with high-energy light rays to thereby increase the electric-field breakdown voltage of diode.

BEST MODE FOR CARRYING OUT THE INVENTION

Embodiments of the diamond semiconductor device of the invention are described below.

The important characteristics of the diamond semiconductor device of the invention are that a pair of electrodes is formed on a diamond substrate therein, at least one interface to the pair of electrodes on the surface of the diamond substrate has a hydrogen termination and at least the surface of the substrate between the two electrodes is an insulating region.

The insulating region of the substrate surface is formed through oxygen termination process or non-termination process. The insulating region is considered to be an oxygen-terminated surface or a non-terminated surface with a thickness of this region one atomic layer level.

FIG. 1 to FIG. 4 are cross-sectional views schematically showing constitution cases of diamond semiconductor devices where the insulating region of the substrate surface is formed through oxygen termination process.

Figure 1:
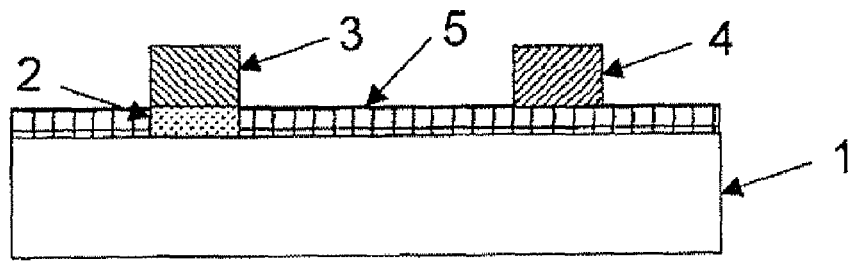
FIG. 1 is a cross-sectional view schematically showing the structure of a diamond semiconductor device of the first type of the invention.

In the case of FIG. 1, an electrode (3) and an electrode (4) are disposed, as spaced from each other, on the same surface of a semiconducting diamond substrate (1); and at the interface between the diamond substrate (1) and the electrode (3), the surface of the diamond substrate (1) is hydrogen-terminated (2). Of the other surfaces of the diamond substrate (1), the surface except the area in which the electrode (3) is disposed, including the interface between the diamond substrate (1) and the electrode (4) and the area between the electrode (3) and the electrode (4), is an insulating region by oxygen termination (5). In this description, "insulating region by oxygen termination" means a region of which the electric resistance is larger than the electric resistance inside the diamond substrate (1) owing to treatment for oxygen termination (5). In this case, the insulating region formed between the electrode (3) and the electrode (4) prevents surface leakage current, and therefore even in severe environments, for example, at high temperature or in vacuum, the device performance can be stably maintained.

Figure 2:
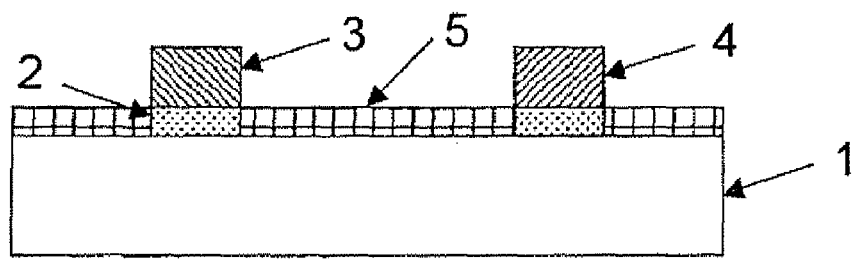
FIG. 2 is a cross-sectional view schematically showing the structure of another diamond semiconductor device of the first type of the invention.

In the case of FIG. 2, an electrode (3) and an electrode (4) are disposed, as spaced from each other, on the same surface of a semiconducting diamond substrate (1); and both at the interface between the diamond substrate (1) and the electrode (3) and at the interface between the diamond substrate (1) and the electrode (4), the surface of the diamond substrate (1) is hydrogen-terminated (2). Of the other surfaces of the diamond substrate (1), the surface except the area in which the electrode (3) and the electrode (4) are disposed, including the area between the electrode (3) and the electrode (4), is an insulating region by oxygen termination (5). Also in this case, the insulating region formed between the electrode (3) and the electrode (4) prevents surface leakage current, and therefore even in severe environments, for example, at high temperature or in vacuum, the device performance can be stably maintained.

Figure 3:
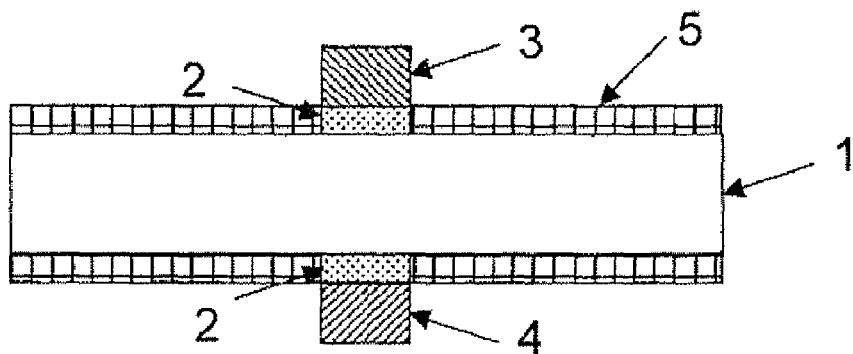
FIG. 3 is a cross-sectional view schematically showing the structure of still another diamond semiconductor device of the first type of the invention.

In the case of FIG. 3, an electrode (3) is disposed on one surface of a semiconducting diamond substrate (1) and an electrode (4) is on the other side of substrate surface thereof. Both at the interface between the diamond substrate (1) and the electrode (3) and at the interface between the diamond substrate (1) and the electrode (4), the surface of the diamond substrate (1) is hydrogen-terminated (2). Of both surfaces of the diamond substrate (1), the surface except the area in which the electrode (3) is disposed and the surface except the area in which the electrode (4) is disposed are insulating regions by oxygen termination (5). In the case of this constitution, when the insulating regions by oxygen termination (5) do not exist, then a surface leakage current may flow, for example, from the electrode (3) in a route toward the substrate surface on the electrode side, the side face of the substrate, the substrate surface on the other side and the other electrode (4); however, owing to the insulating regions by oxygen termination (5), the surface leakage current may be prevented.

Figure 4:
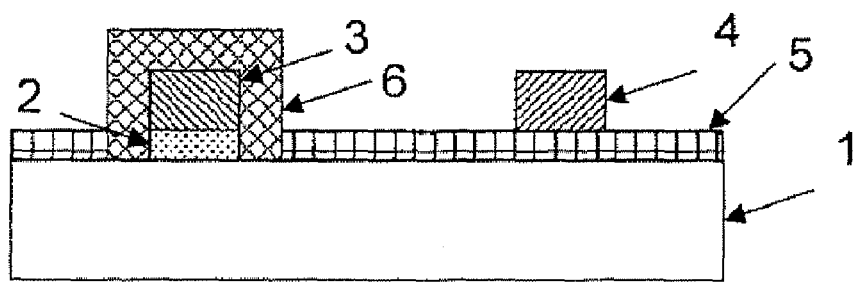
FIG. 4 is a cross-sectional view schematically showing the structure of still another diamond semiconductor device of the first type of the invention.

In the case of FIG. 4, the upper part of the electrode (3) disposed on the hydrogen-terminated surface (2) of the diamond substrate (1), as in the constitution of FIG. 1, is covered with a protective layer (6). The protective layer (6) is one optionally provided for the purpose of protecting the electrode (3) from oxidation and from mechanical damage.

In the cases of these embodiments, the hydrogen-terminated surface (2) of the diamond substrate (1) is irradiated with high-energy light rays in an ozone or active oxygen atmosphere, thereby forming an oxygen-terminated insulating region (5). Specifically, the radiated high-energy rays cut the bond between the hydrogen and the diamond constituting the hydrogen termination, while ozone or active oxygen directly contact with the thus-cut hydrogen to form an oxide (water) and also form the oxygen termination (5).

The wavelength of the high-energy light rays must be at most 287 nm corresponding to the C—H bonding energy; and preferably, the rays are UV rays at around 100 nm at which the cross section where the C—H bond is cut could be the largest. For example, preferred are monochromatic light rays, for example, at 126 nm or 172 nm. Preferably, the light irradiance is larger, and for example, it is preferably at least 1 mW/cm$^2$. The irradiation intensity must be uniform in the hydrogen-terminated surface (2) of the diamond substrate (1); and therefore, the light irradiation area is preferably at least 4 mm$^2$. To attain it, use of an excimer lamp is easy.

The electrodes (3) and (4) may be formed in various known methods such as a vapor evaporation method, etc. The thickness of the electrodes (3) and (4) may be suitably determined depending on the purpose and the use, and is generally from 20 to 500 nm or so.

The hydrogen termination (2) employed in the invention enables formation of a conductive ohmic electrode or a rectifying Schottky electrode not requiring heat treatment. In the invention, in addition, the electric conductive part of the diamond substrate is not a surface-conductive layer but is an inside-conductive constitution, that is diamond bulk conduction, and therefore, the device is stably workable even in severe environments such as high temperature, etc.

For p-type diamond, for example, when gold is used as the electrode, then it is known that the hydrogen termination has conductive characteristics and the oxygen termination has diode characteristics. According to conventional methods, in case where multiple electrodes are formed on the surface of a diamond substrate, it is impossible to make the termination structure at the interface between a part of those electrodes and the substrate differ from the termination structure at the interface between the other electrode and the substrate.

In the invention, even on the same substrate surface, the termination structure at the interface between an electrode and the substrate can be made to differ from that at the interface between any other electrode and the substrate, and the same metal used can form Schottky junction that shows diode characteristics and ohmic junction that shows current-conductive characteristics. Therefore in the invention, diodes can be fabricated, using the same metal as the electrode material.

In Schottky junction, preferred is aluminium or magnesium having a low work function for p-type diamond; and for n-type diamond, preferred is gold or platinum having a high work function. In ohmic junction, the metal is preferably gold or platinum having a high work function for p-type diamond, but is preferably aluminium or magnesium having a low work function for n-type diamond. Needless-to-say, any other suitable materials may be selected and used.

In the case where the protective layer (6) is provided as in FIG. 4, the protective layer (6) may be formed of one type of an electric conductive material, but may be a laminate-structured film comprising two or more different types of electric conductive materials. Typically, the layer has a three-layered laminate structure; and in this case, preferably, the lowermost layer is formed of a material having high adhesiveness to diamond, and the uppermost layer is formed of a material capable of preventing the oxidation of the whole electrode or having high adhesiveness to wires in wire bonding in the subsequent process. The interlayer is preferably one being able to be a barrier layer to prevent the metal of the uppermost layer from mixing with the metal of the lowermost layer.

The outer periphery of the protective layer (6) is larger than the outer periphery of the electrode (3); and therefore, a part of the lowermost layer directly adheres to diamond, and a part of the lowermost layer covers the top of the electrode (3); and accordingly, even under mechanical shock or in high-temperature environments, the electrode metal is protected from peeling or cohesion and is kept stable so far as the protective layer (6) is not damaged.

For example, a lamination of titanium (lowermost layer), platinum (interlayer) and gold (uppermost layer) is typical.

Other electric conductive materials usable in the same manner as above are as follows. The lowermost layer is a metal that reacts with diamond to form a carbide, including titanium, molybdenum, tungsten, tantalum, chromium, zirconium, niobium, silicon, vanadium, manganese. For the interlayer and the uppermost layer, there are mentioned nickel, palladium, platinum, gold, silver, copper, cobalt, rhodium, iridium, aluminium, gallium, indium; however, these are not limitative.

Figure 5:
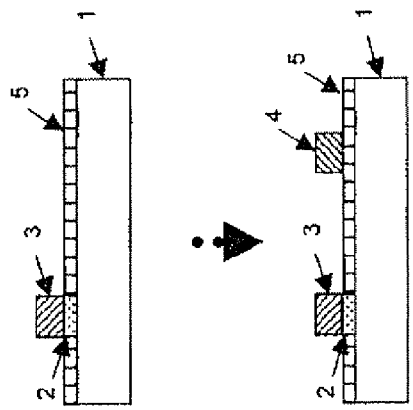
FIG. 5 is an explanatory view of a production method for the diamond semiconductor device of FIG. 1.
Figure 5:
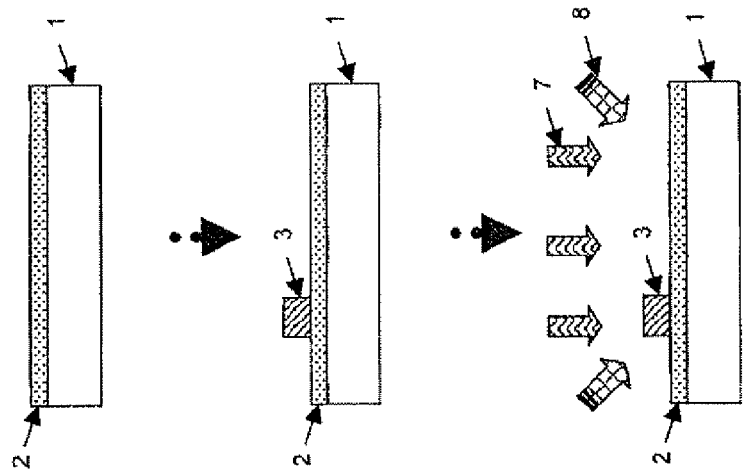

An example of the production method for the diamond semiconductor device having the constitution shown in FIG. 1 is described below, with reference to FIG. 5.

Step 1:
The top face of a semiconducting diamond substrate (1) is processed for hydrogen termination, for example, according to a microwave plasma CVD method, thereby forming a hydrogen termination (2).

Step 2:
According to an electrode formation method through ordinary vacuum vapor deposition, one electrode (3) is formed on the hydrogen-terminated surface of the substrate.

Step 3:
In an ozone or active hydrogen atmosphere (8), the surface of the diamond substrate (1) covered with the hydrogen termination (2) is irradiated with high-energy light rays (7) thereby forming an insulating region with an oxygen termination (5). The ozone or active hydrogen atmosphere (8) may be formed by filling the reaction system with an oxygen-containing vapor followed by applying high-energy light rays (7) to both the surface of the diamond substrate (1) and the vapor.

Step 4:
Another electrode (4) is formed in a predetermined position according to an electrode formation method through ordinary vacuum vapor deposition.

According to the above process, a diamond semiconductor device having the constitution shown in FIG. 1 can be fabricated.

Other diamond semiconductor devices than those having the constitution of FIG. 1 can also be fabricated basically according to the same process as above though somewhat differing from it.

Next described is a case of forming the insulating region in the substrate surface through non-termination process.

FIG. 6 to FIG. 9 are cross-sectional views schematically showing constitution embodiments of a diamond semiconductor device in which the insulating region of the substrate surface is formed through non-termination process.

Figure 6:
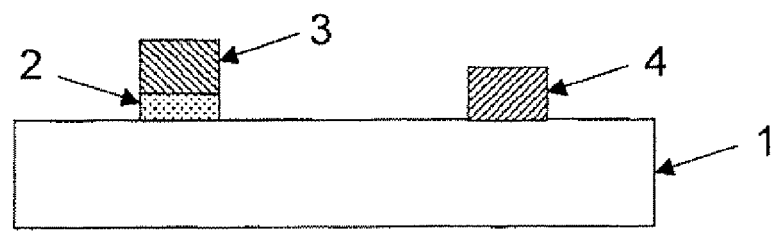
FIG. 6 is a cross-sectional view schematically showing the structure of a diamond semiconductor device of the second type of the invention.

In the case of FIG. 6, an electrode (3) and an electrode (4) are disposed, as spaced from each other, on the same surface of a semiconducting diamond substrate (1); and at the interface between the diamond substrate (1) and the electrode (3), the surface of the diamond substrate (1) is hydrogen-terminated (2). Of the other surfaces of the diamond substrate (1), the surface except the area in which the electrode (3) is fabricated, including the interface between the diamond substrate (1) and the electrode (4) and the area between the electrode (3) and the electrode (4), is an insulating region by non-termination. In this description, "non-termination" is meant to indicate a surface region where any termination atom such as hydrogen and oxygen does not exist. The wording "insulating region by non-termination" means a region of which the electric resistance is larger than the electric resistance inside the diamond substrate (1) owing to treatment for non-termination. In this case, the insulating region formed between the electrode (3) and the electrode (4) prevents surface leakage current, and therefore even in severe environments, for example, at high temperature or in vacuum, the device performance can be stably maintained.

Figure 7:
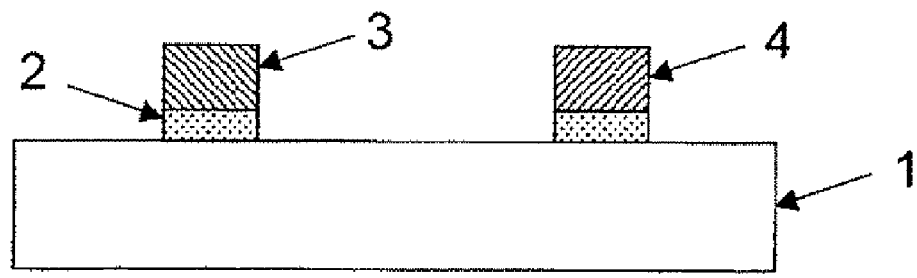
FIG. 7 is a cross-sectional view schematically showing the structure of another diamond semiconductor device of the second type of the invention.

In the case of FIG. 7, an electrode (3) and an electrode (4) are disposed, as spaced from each other, on the same surface of a semiconducting diamond substrate (1); and both at the interface between the diamond substrate (1) and the electrode (3) and at the interface between the diamond substrate (1) and the electrode (4), the surface of the diamond substrate (1) is hydrogen-terminated (2). Of the other surfaces of the diamond substrate (1), the surface except the area in which the electrode (3) and the electrode (4) are fabricated, including the area between the electrode (3) and the electrode (4), is an insulating region by non-termination. Also in this case, the insulating region formed between the electrode (3) and the electrode (4) prevents surface leakage current, and therefore even in severe environments, for example, at high temperature or in vacuum, the device performance can be stably maintained.

Figure 8:
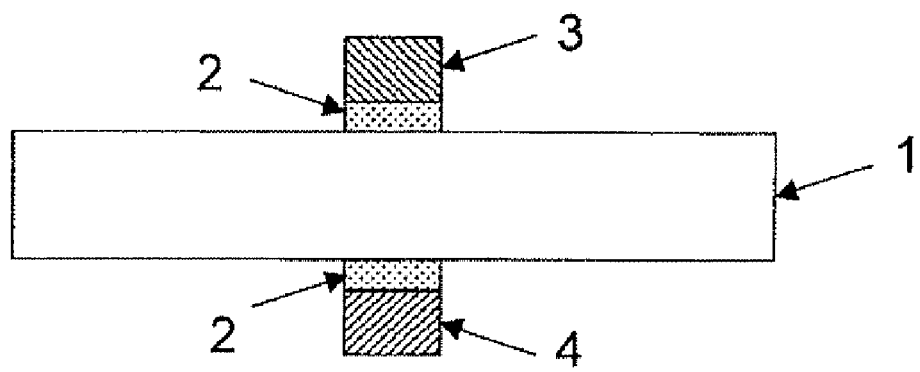
FIG. 8 is a cross-sectional view schematically showing the structure of still another diamond semiconductor device of the second type of the invention.

In the case of FIG. 8, an electrode (3) is disposed on one surface of a semiconducting diamond substrate (1) and an electrode (4) is on the other surface thereof. Both at the interface between the diamond substrate (1) and the electrode (3) and at the interface between the diamond substrate (1) and the electrode (4), the surface of the diamond substrate (1) is hydrogen-terminated (2). Of both surfaces of the diamond substrate (1), the surface except the area in which the electrode (3) is fabricated and the surface except the area in which the electrode (4) is fabricated are insulating regions by non-termination. In the case of this constitution, when the insulating regions by non-termination do not exist, then a surface leakage current may flow, for example, from the electrode (3) in a route toward the substrate surface on the electrode side, the side face of the substrate, the substrate surface on the other side and the other electrode (4); however, owing to the insulating regions by non-termination, the surface leakage current may be prevented.

Figure 9:
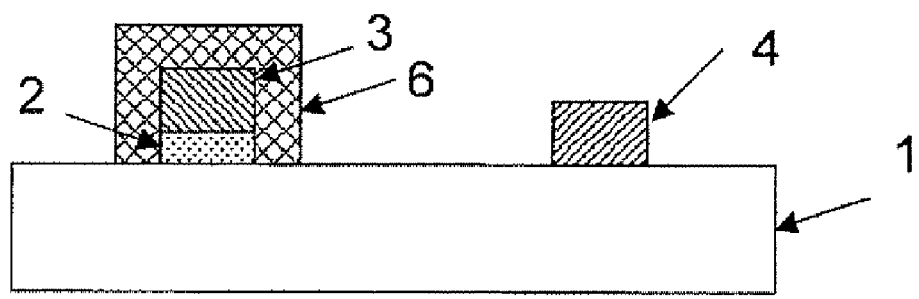
FIG. 9 is a cross-sectional view schematically showing the structure of still another diamond semiconductor device of the second type of the invention.

In the case of FIG. 9, the upper part of the electrode (3) disposed on the hydrogen-terminated surface (2) of the diamond substrate (1), as in the constitution of FIG. 6, is covered with a protective layer (6). The protective layer (6) is one optionally provided for the purpose of protecting the electrode (3) from oxidation and from mechanical damage.

The diamond semiconductor devices having an insulating region by non-termination, as shown in FIG. 6 to FIG. 9, differ from the above-mentioned diamond semiconductor devices having an insulating region by oxygen termination (5) in the "non-termination" and the "oxygen termination" but the same as the latter in the others. Accordingly, the difference is mainly described below.

In the invention, the surface of the diamond substrate (1) having a hydrogen termination (2) is irradiated with high-energy light rays in vacuum, thereby forming an insulating region through non-termination process. Specifically, the radiated high-energy rays cut the bond between the hydrogen and the diamond constituting the hydrogen termination, thereby removing hydrogen from the surface to form a non-terminated surface.

The wavelength of the high-energy light rays must be at most 287 nm corresponding to the C—H bonding energy, like in the above-mentioned cases; and preferably, the rays are UV rays at around 100 nm at which the cross section where the C—H bond is cut could be the largest. For example, preferred are monochromatic light rays, for example, at 126 nm or 172 nm. Preferably, the light irradiance is larger, and for example, it is preferably at least 1 mW/cm$^2$. The irradiation intensity must be uniform in the hydrogen-terminated surface (2) of the diamond substrate (1); and therefore, the light irradiation area is preferably at least 4 mm$^2$. To attain it, use of an excimer lamp is easy. Also usable are vacuum UV rays or soft X-rays.

In the invention, the insulating region by oxygen termination and the insulating region by non-termination are positioned as regions that exhibit the same effect in diamond semiconductor devices in that they stabilize the conductivity in the exposed surface part between electrodes and enhance high-voltage resistance of Schottky diodes at the interface to electrode metal.

Figure 10:
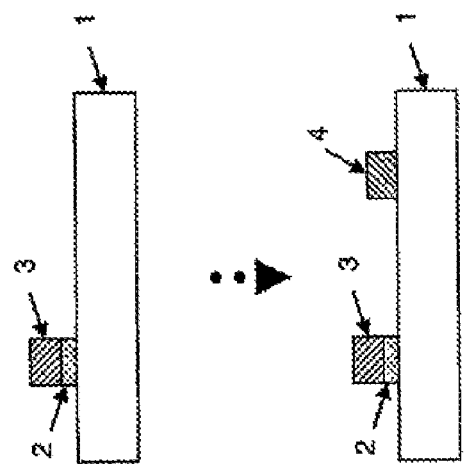
FIG. 10 is an explanatory view of a production method for the diamond semiconductor device of FIG. 6.
Figure 10:
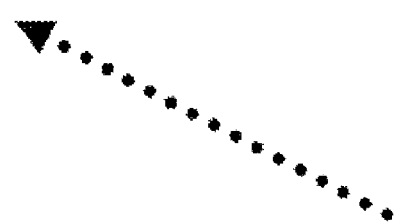
Figure 10:
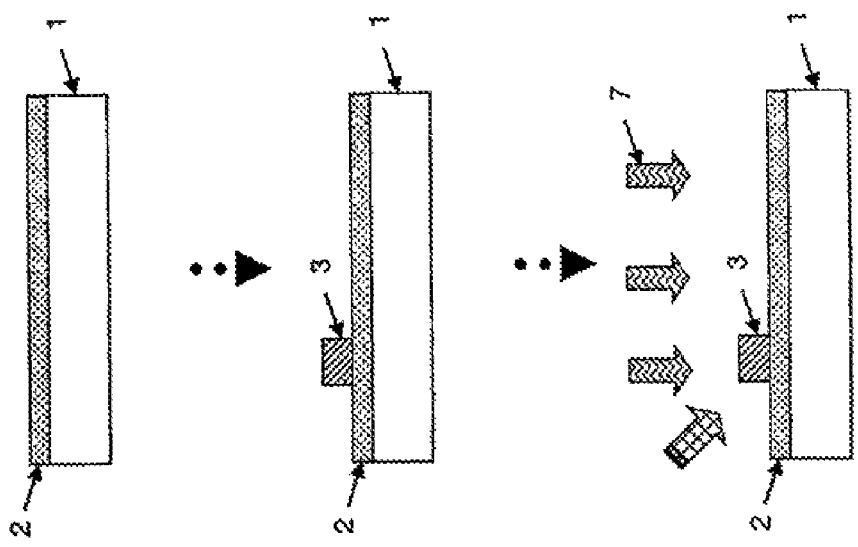

An example of the production method for the diamond semiconductor device having the constitution shown in FIG. 6 is described below, with reference to FIG. 10.

Step 1:
The top face of a semiconducting diamond substrate (1) is processed for hydrogen termination, for example, according to a microwave plasma CVD method, thereby forming a hydrogen termination (2).

Step 2:
According to an electrode formation method through ordinary vacuum vapor deposition, one electrode (3) is formed on the hydrogen-terminated surface of the substrate.

Step 3:
This is irradiated with high-energy light rays (7) in vacuum, thereby forming an insulating region with non-termination.

Step 4:
Another electrode (4) is formed in a predetermined position according to an electrode formation method through ordinary vacuum vapor deposition.

According to the above process, a diamond semiconductor device having the constitution shown in FIG. 6 can be fabricated.

Other diamond semiconductor devices than those having the constitution of FIG. 6 can also be fabricated basically according to the same process as above though somewhat differing from it.

The above description is to exemplify the materials and their properties for the parts constituting diamond semiconductor devices and the preferred data and ranges in oxygen termination treatment or non-termination treatment; however, these may be suitably determined in accordance with the purpose and the use thereof.

EXAMPLES

The invention is described in more detail with reference to the following Examples and Comparative Examples.

Reference Example

This Reference Examples is to demonstrate the insulation on the surface of a diamond substrate.

A non-doped diamond single crystal (dimension: 3 mm length×3 mm width×10 μm thickness) formed on a high-resistance diamond single crystal (dimension 3 mm length×3 mm width×0.5 mm thickness) was used; and the surface of the single-crystal substrate was processed for hydrogen termination according to a microwave plasma CVD method under the condition mentioned below.

Condition:
Reaction gas, hydrogen; reaction pressure, 100 Torr; substrate temperature, 900° C.; reaction time, 1 hour; microwave power, 700 W.

Next, in an oxygen gas-containing atmosphere, UV rays from an excimer lamp are radiated to the hydrogen-terminated diamond substrate surface under the condition mentioned below.

(A) Wavelength, 172 nm; irradiance, 100 mW/cm$^2$; irradiation time, 10 min; atmosphere, oxygen; pressure, 10 Torr.
(B) Wavelength, 172 nm; irradiance, 10 mW/cm$^2$; irradiation time, 1 min; atmosphere, air; pressure, 760 Torr.
(C) Wavelength, 126 nm; irradiance, 1 mW/cm$^2$; irradiation time, 10 min; atmosphere, oxygen; pressure, 1 Torr.

Figure 11:
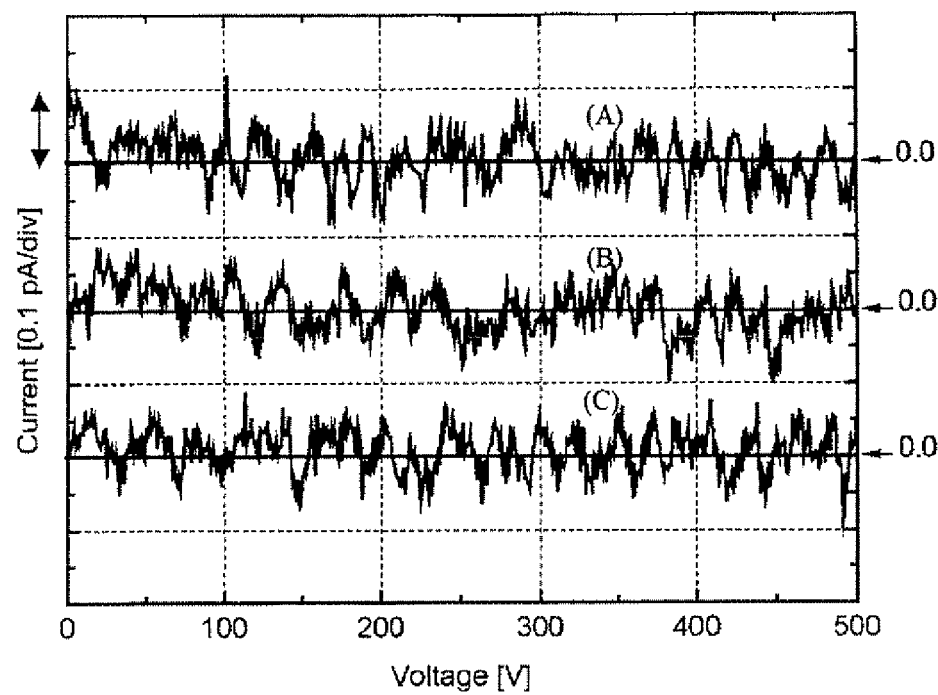
FIG. 11 is a graph showing the current profile of the diamond semiconductor device of Reference Example.

A pair of electrodes of a titanium/gold laminate film (titanium, 20 nm thickness; gold, 40 nm thickness) were formed on the above-processed substrate according to a vacuum vapor deposition method. The electrode-to-electrode distance was 150 μm. After the formation of the electrodes, this was heat-treated in vacuum at 600° C. for 30 minutes to produce a sample. The electric conductivity characteristics of the sample were determined at room temperature according to a current-voltage method. The current-voltage method is as follows: In the same test circuit as that for the resistance measurement method with 2 terminals as described in JIS C 2525, a power source and a current meter are used in place of the resistance meter, and the diode characteristics of the sample are determined. This is a test method of measuring current by sweeping voltage. The result is shown in FIG. 11. Zero of the current value data is in the right axis. The part above zero is plus, and the part below zero is minus. The region shown by the arrow in the vertical axis is 0.1 (pA).

From FIG. 11, it is known that, even when a voltage of 500 V was applied between the electrodes, the leakage current was below the detection level of the meter, and therefore, the diamond surface was converted to have sufficient insulation.

Example 1

A p-type semiconducting single crystal doped with boron at a concentration of $2 \times 10^{15}$ cm$^{-3}$ (dimension: 3 mm length×3 mm width×20 µm thickness) was formed on a high-resistance diamond single crystal (dimension: 3 mm length×3 mm width×0.5 mm thickness), and the thus-formed crystal was used as a substrate. In the same manner as in the above-mentioned Reference Example, the surface of the single-crystal substrate (1) was processed for hydrogen termination.

Next, using gold as an electrode material, an electrode (3) having a thickness of 40 nm was formed on the hydrogen-terminated surface (2), according to a vacuum vapor deposition method.

Next, using an excimer lamp, UV rays at a wavelength of 172 nm were radiated to the substrate (1) with the electrode (3) formed thereon, at an irradiance of 10 mW/cm$^2$ for an irradiation time of 10 minutes in an oxygen atmosphere under the condition of an oxygen partial pressure of 100 Torr, thereby forming an insulating region by oxygen termination (2) on the surface of the substrate (1) except the area where the electrode (3) was formed thereon.

Next, using gold as an electrode material, an electrode (4) having a thickness of 40 nm was formed in a suitable region on the hydrogen-terminated surface (2), according to a vacuum vapor deposition method, thereby fabricating a diamond semiconductor device having the structure shown in FIG. 1.

Figure 12:
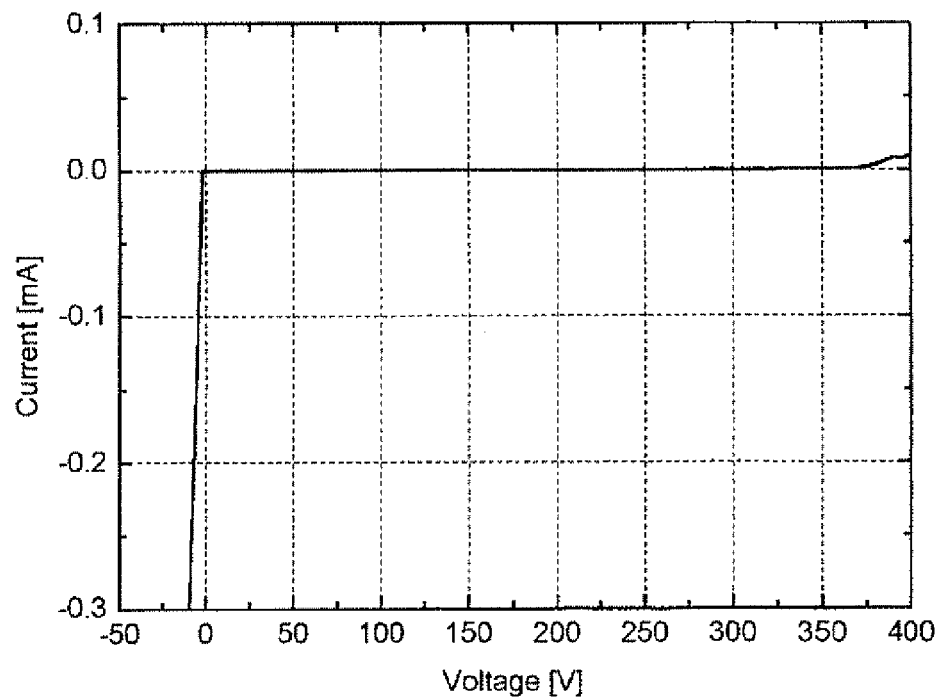
FIG. 12 is a graph showing the current profile of the diamond semiconductor device of Example 1.

The diamond semiconductor device fabricated in the above was tested for the electric conductivity characteristics thereof at room temperature according to a current-voltage test method. The test result is shown in FIG. 12 as a graph. The graph confirms good diode characteristics. In addition, the device had a breakdown voltage of at least 400 V, therefore having excellent voltage resistance. No surface leakage current was detected.

Example 2

A diamond semiconductor device having the structure shown in FIG. 2 was fabricated in the same manner as in Example 1, in which, however, the electrode (4) of gold was formed on the hydrogen-terminated surface (2).

Figure 13:
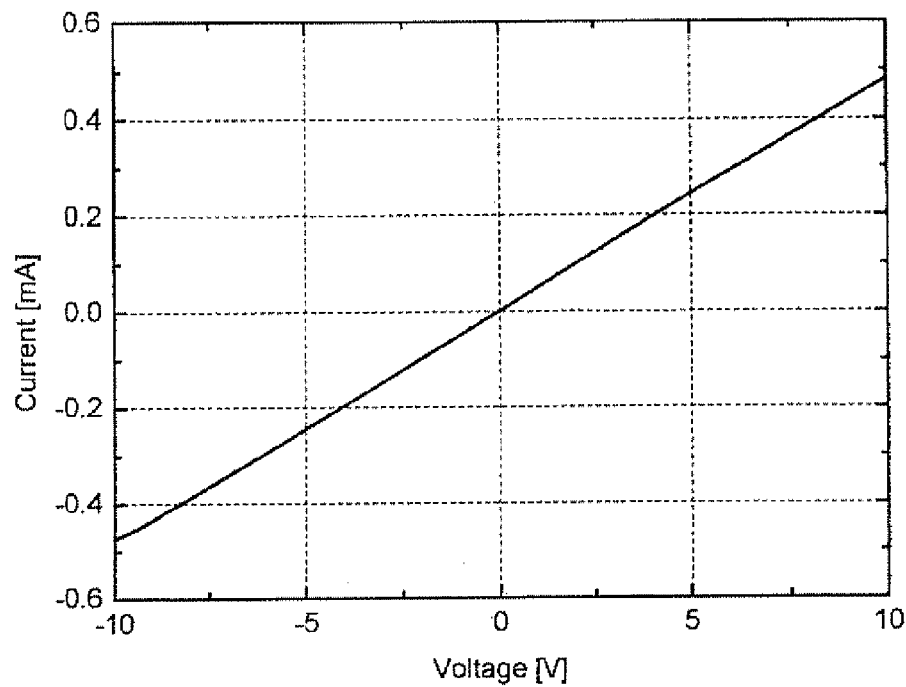
FIG. 13 is a graph showing the current profile of the diamond semiconductor device of Example 2.

The diamond semiconductor device was tested for the electric conductivity characteristics thereof at room temperature according to a current-voltage test method in the same manner as in Example 1. The test result is shown in FIG. 13 as a graph. The graph confirms good conductivity. No surface leakage current was detected.

Example 3

A p-type semiconducting single crystal doped with boron at a concentration of $1 \times 10^{16}$ cm$^{-3}$ (dimension: 3 mm length×3 mm width×0.5 mm thickness) was used as a substrate; and in the same manner as in the above-mentioned Reference Example, both surfaces of the single-crystal substrate (1) were processed for hydrogen termination.

Next, using gold as an electrode material, an electrode (3) having a thickness of 40 nm was formed on the hydrogen-terminated surface (2), according to a vacuum vapor deposition method; and then similarly, using gold as an electrode material, an electrode (4) having a thickness of 40 nm was formed on the other surface opposite to the hydrogen-terminated surface (2), according to a vacuum vapor deposition method.

Next, using an excimer lamp, UV rays at a wavelength of 172 nm were radiated to the substrate (1) with the electrode (3) formed thereon, at an irradiance of 10 mW/cm$^2$ for an irradiation time of 10 minutes in an oxygen atmosphere under the condition of an oxygen partial pressure of 100 Torr, thereby forming an insulating region by oxygen termination (2) on the surface of the substrate (1) except the area where the electrode (3) was formed thereon. Similarly, an insulating region by oxygen termination (2) was formed on the surface of the substrate (1) except the area where the electrode (4) was formed thereon. Accordingly, a diamond semiconductor device having the constitution shown in FIG. 3 was fabricated.

Figure 14:
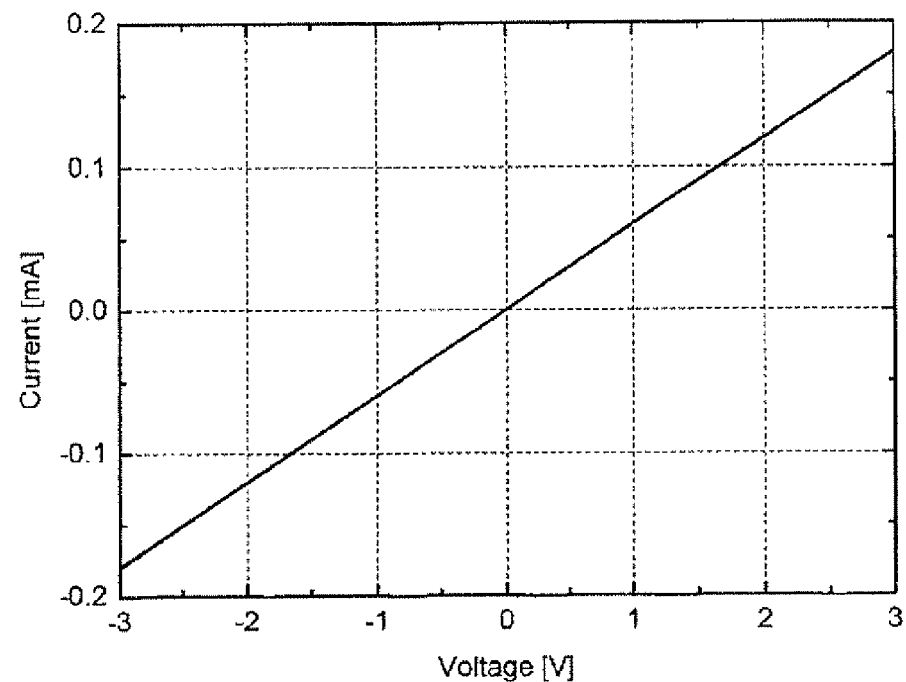
FIG. 14 is a graph showing the current profile of the diamond semiconductor device of Example 3.

The diamond semiconductor device fabricated in the above was tested for the electric conductivity characteristics thereof at room temperature according to a current-voltage test method. The test result is shown in FIG. 14 as a graph. The graph confirms good conductivity. No surface leakage current was detected.

Example 4

A diamond semiconductor device having the structure shown in FIG. 2 was fabricated in the same manner as in Example 2, in which, however, an electrode (4) of aluminium was provided in place of the electrode (4) of gold.

Figure 15:
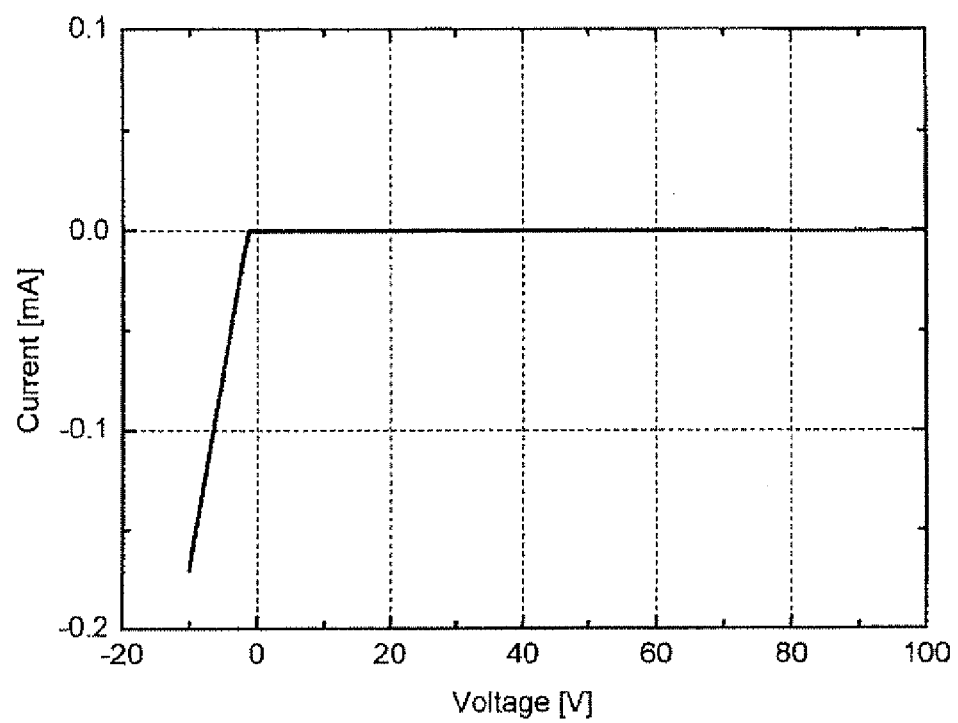
FIG. 15 is a graph showing the current profile of the diamond semiconductor device of Example 4.

The diamond semiconductor device was tested for the electric conductivity characteristics thereof at room temperature according to a current-voltage test method, like in Example 2. The test result is shown in FIG. 15 as a graph. The graph confirms good diode characteristics. The result verifies that, in the case where p-type diamond is used as the substrate and where the diamond surface at the interface between the electrode and diamond is hydrogen-terminated, then the device fabricated can have ohmic characteristics when gold having a high work function is used as the electrode material, and the device can have Schottky characteristics when aluminium having a low work function is used. No surface leakage current was detected.

Example 5

A diamond semiconductor device having the structure shown in FIG. 4 was fabricated in the same manner as in Example 1, in which, however, after the electrode (3) of gold was provided, a protective layer (6) of a laminate of titanium (lowermost layer: 20 nm thickness), platinum (interlayer: 20 nm thickness) and gold (uppermost layer: 20 nm thickness) was provided according to a vacuum vapor deposition method.

The diamond semiconductor device worked stably even at high temperature. No surface leakage current was detected.

Comparative Reference Example

In the same manner as in Reference Example and using a non-doped diamond single-crystal substrate with hydrogen termination formed on the surface thereof, the hydrogen-terminated surface of the diamond substrate was irradiated with UV ray or short-wave visible rays from an ultra-high pressure mercury lamp, in an oxygen gas-containing atmosphere under the condition mentioned below.

Wavelength, at least 290 nm (main emission wavelengths: 365 nm, 405 nm, and 436 nm); irradiance (wavelength integration), 6 mW/cm$^2$; irradiation time, 120 min; atmosphere, oxygen; pressure, 100 Torr.

The same pair of electrodes as in Reference Example were formed on the thus-processed substrate according to a vacuum vapor deposition method, this subjected to the same heat treatment as therein to produce a sample. The sample was tested for the electric conductivity characteristics at room temperature according to a current-voltage method. As a result, as compared with the sample before the above-mentioned treatment, this did not change in the electric conductivity characteristics, and this had good electric conductivity, but could not have insulation characteristics as in Reference Example.

Comparative Example 1

Figure 16:
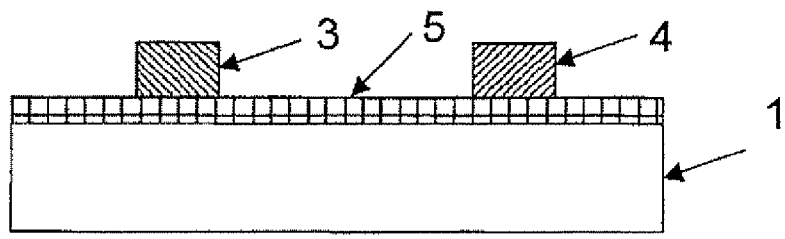
FIG. 16 is a cross-sectional view schematically showing the structure of the diamond semiconductor device of Comparative Example 1.

A device having the structure shown in FIG. 16 was fabricated in the same manner as in Example 2, in which, however, the hydrogen termination (2) was not provided but the entire surface of the substrate (1) was an insulating region by oxygen termination (5).

Figure 17:
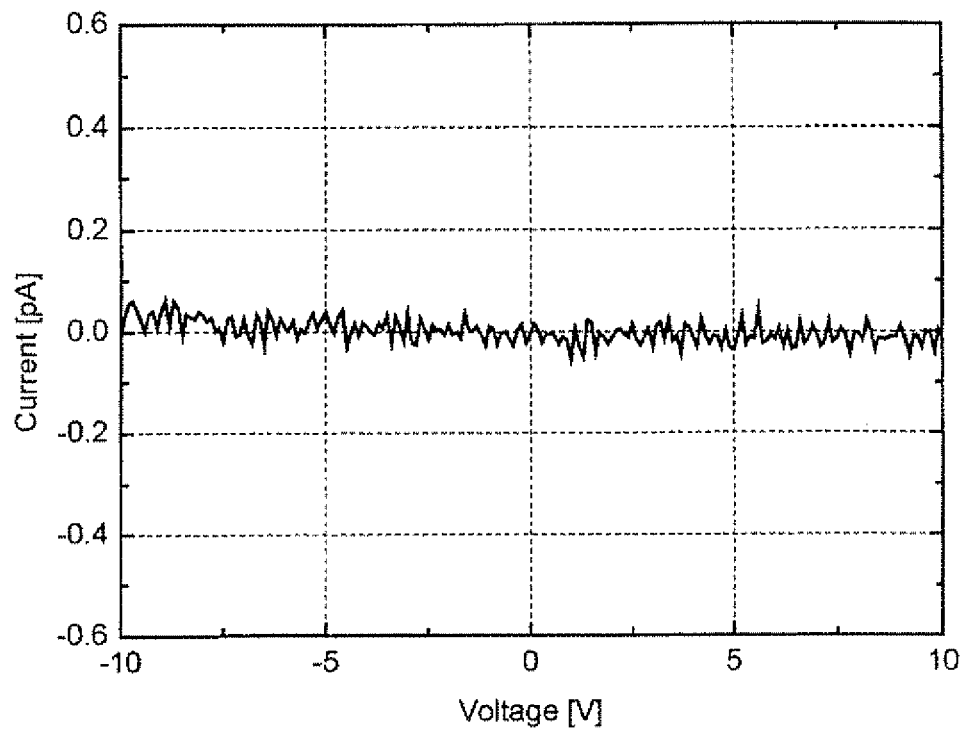
FIG. 17 is a graph showing the current profile of the diamond semiconductor device of Comparative Example 1.

The device was tested for the electric conductivity characteristics thereof at room temperature according to a current-voltage test method in the same manner as in Example 1. The test result is shown in FIG. 17 as a graph. From the graph, it is known that the device could not have electric conductivity.

Example 6

A p-type semiconducter single crystal doped with boron at a concentration of $2\times10^{15}$ cm$^{-3}$ (dimension: 3 mm length×3 mm width×20 μm thickness) was formed on a high-resistance diamond single crystal (dimension: 3 mm length×3 mm width×0.2 mm thickness), and the thus-formed crystal was used as a substrate. In the same manner as in the above-mentioned Reference Example, the surface of the single-crystal substrate (1) was processed for hydrogen termination.

Next, using gold as an electrode material, an electrode (3) having a thickness of 40 nm was formed on the hydrogen-terminated surface (2), according to a vacuum vapor deposition method.

Next, using an excimer lamp, UV rays at a wavelength of 172 nm were radiated to the substrate (1) with the electrode (3) formed thereon, at an irradiance of 10 mW/cm$^2$ for an irradiation time of 60 minutes in vacuum, thereby forming an insulating region by non-termination on the surface of the substrate (1) except the area where the electrode (3) was formed thereon.

Next, using gold as an electrode material, an electrode (4) having a thickness of 40 nm was formed in a suitable region of the substrate surface where the insulating region by non-termination was formed, according to a vacuum vapor deposition method, thereby fabricating a diamond semiconductor device having the structure shown in FIG. 6.

Figure 18:
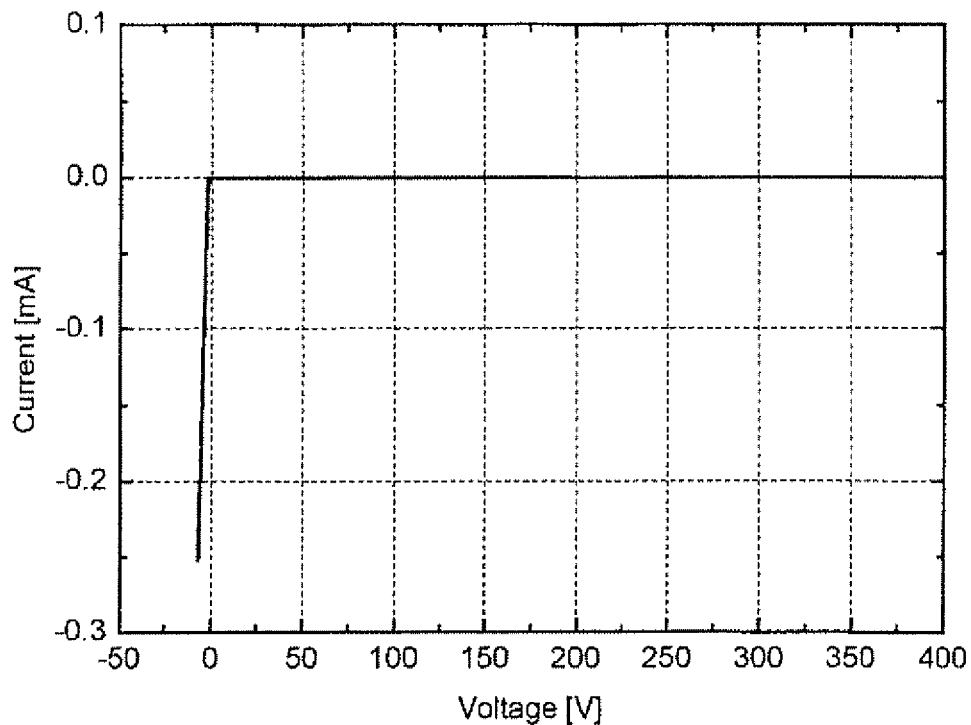
FIG. 18 is a graph showing the current profile of the diamond semiconductor device of Example 6.

The diamond semiconductor device fabricated in the above was tested for the electric conductivity characteristics thereof at room temperature according to a current-voltage test method. The test result is shown in FIG. 18 as a graph. The graph confirms good diode characteristics. In addition, the device had a breakdown voltage of at least 400 V, therefore having excellent voltage resistance. No surface leakage current was detected.

Example 7

A diamond semiconductor device having the structure shown in FIG. 7 was fabricated in the same manner as in Example 6, in which, however, the electrode (4) of gold was formed on the hydrogen-terminated surface (2).

Figure 19:
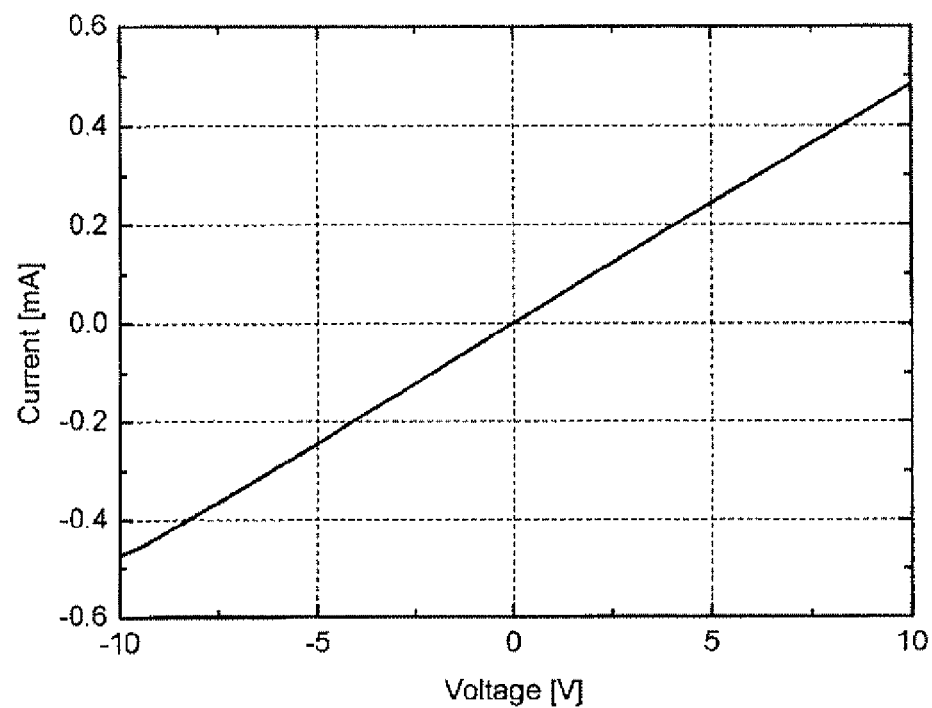
FIG. 19 is a graph showing the current profile of the diamond semiconductor device of Example 7.

The diamond semiconductor device was tested for the electric conductivity characteristics thereof at room temperature according to a current-voltage test method in the same manner as in Example 6. The test result is shown in FIG. 19 as a graph. The graph confirms good conductivity. No surface leakage current was detected.

Example 8

A diamond semiconductor device having the structure shown in FIG. 7 was fabricated in the same manner as in Example 7, in which, however, an electrode (4) of aluminium was provided in place of the electrode (4) of gold.

Figure 20:
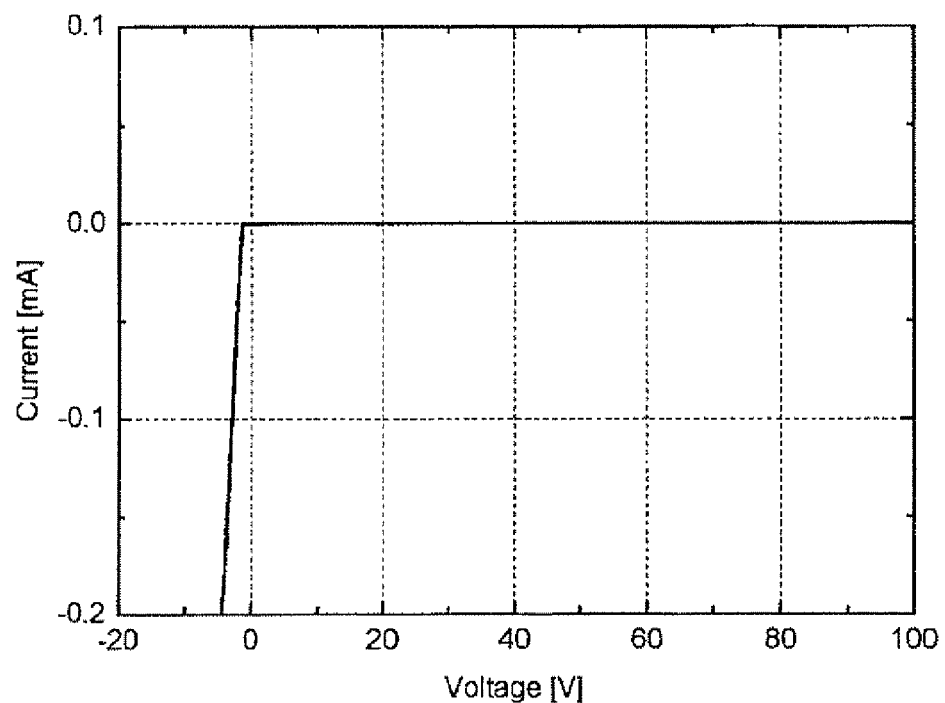
FIG. 20 is a graph showing the current profile of the diamond semiconductor device of Example 8.

The diamond semiconductor device was tested for the electric conductivity characteristics thereof at room temperature according to a current-voltage test method, like in Example 5. The test result is shown in FIG. 20 as a graph. The graph confirms good diode characteristics. The result verifies that, in the case where p-type diamond is used as the substrate and where the diamond surface at the interface between the electrode and diamond is hydrogen-terminated, then the device fabricated can have ohmic characteristics when gold having a high work function is used as the electrode material, and the device can have Schottky characteristics when aluminium having a low work function is used. No surface leakage current was detected.

Example 9

A p-type semiconducting single crystal doped with boron at a concentration of $1\times10^{16}$ cm$^{-3}$ (dimension: 3 mm length×3 mm width×0.2 mm thickness) was used as a substrate. In the same manner as in the above-mentioned Reference Example, the surface of the single-crystal substrate (1) was processed for hydrogen termination.

Next, using gold as an electrode material, an electrode (3) having a thickness of 40 nm was formed on the hydrogen-terminated surface (2), according to a vacuum vapor deposition method. Also using gold as an electrode material, an electrode (4) having a thickness of 40 nm was formed on the opposite surface according to a vacuum vapor deposition method.

Next, using an excimer lamp, UV rays at a wavelength of 172 nm were radiated to the substrate (1) with the electrode (3) formed thereon, at an irradiance of 10 mW/cm$^2$ for an irradiation time of 60 minutes in vacuum, thereby forming an insulating region by non-termination on the surface of the substrate (1) except the area where the electrode (3) was formed thereon. Similarly, an insulating region by non-termination was formed on the surface of the substrate (1) except the area where the electrode (4) was formed. Accordingly, a diamond semiconductor device having the structure shown in FIG. 9 was fabricated.

Figure 21:
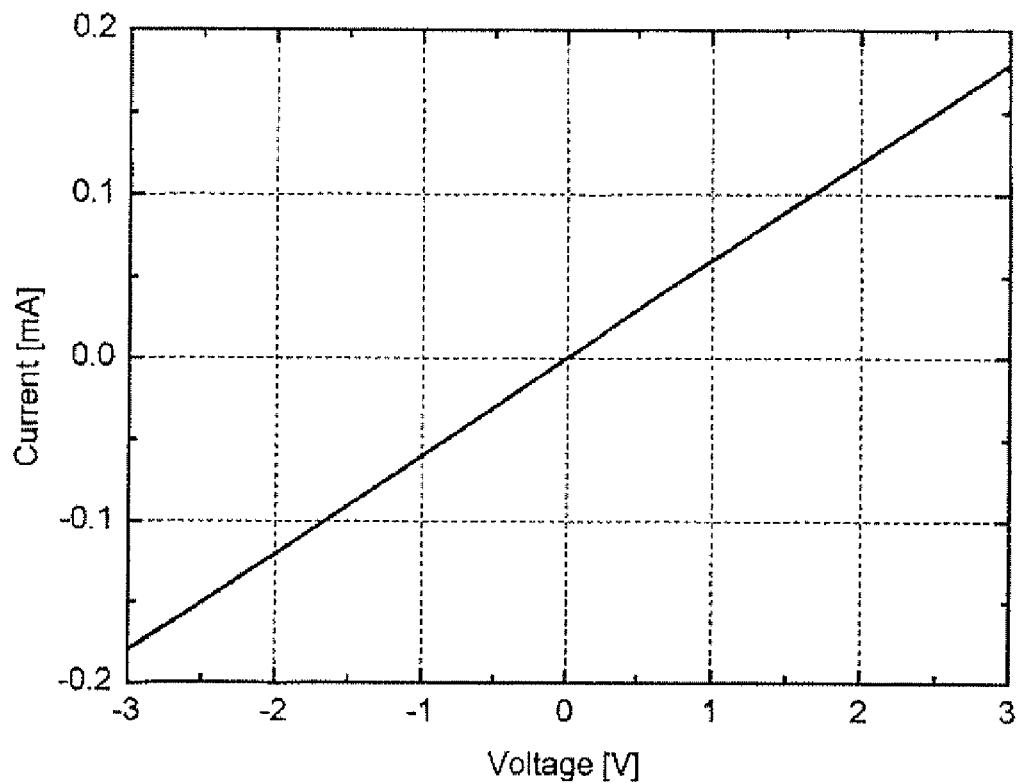
FIG. 21 is a graph showing the current profile of the diamond semiconductor device of Example 9.

The diamond semiconductor device fabricated in the above was tested for the electric conductivity characteristics thereof at room temperature according to a current-voltage test method. The test result is shown in FIG. 21 as a graph. The graph confirms good diode characteristics. No surface leakage current was detected.

Example 10

A diamond semiconductor device having the structure shown in FIG. 9 was fabricated in the same manner as in Example 6, in which, however, after the electrode (3) of gold was provided, a protective layer (6) of a laminate of titanium (lowermost layer: 20 nm thickness), platinum (interlayer: 20 nm thickness) and gold (uppermost layer: 20 nm thickness) was provided according to a vacuum vapor deposition method.

The diamond semiconductor device worked stably even at high temperature. No surface leakage current was detected.

Comparative Example 2

Figure 22:
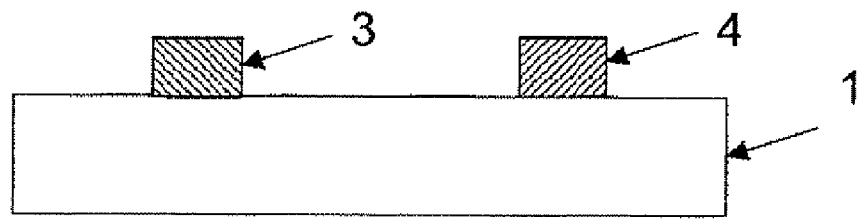
FIG. 22 shows schematically the structure of the diamond semiconductor device of Comparative Example 2.

A device having the structure shown in FIG. 22 was fabricated in the same manner as in Example 7, in which, however, the hydrogen termination (2) was not provided but the entire surface of the substrate (1) was an insulating region by non-termination.

Figure 23:
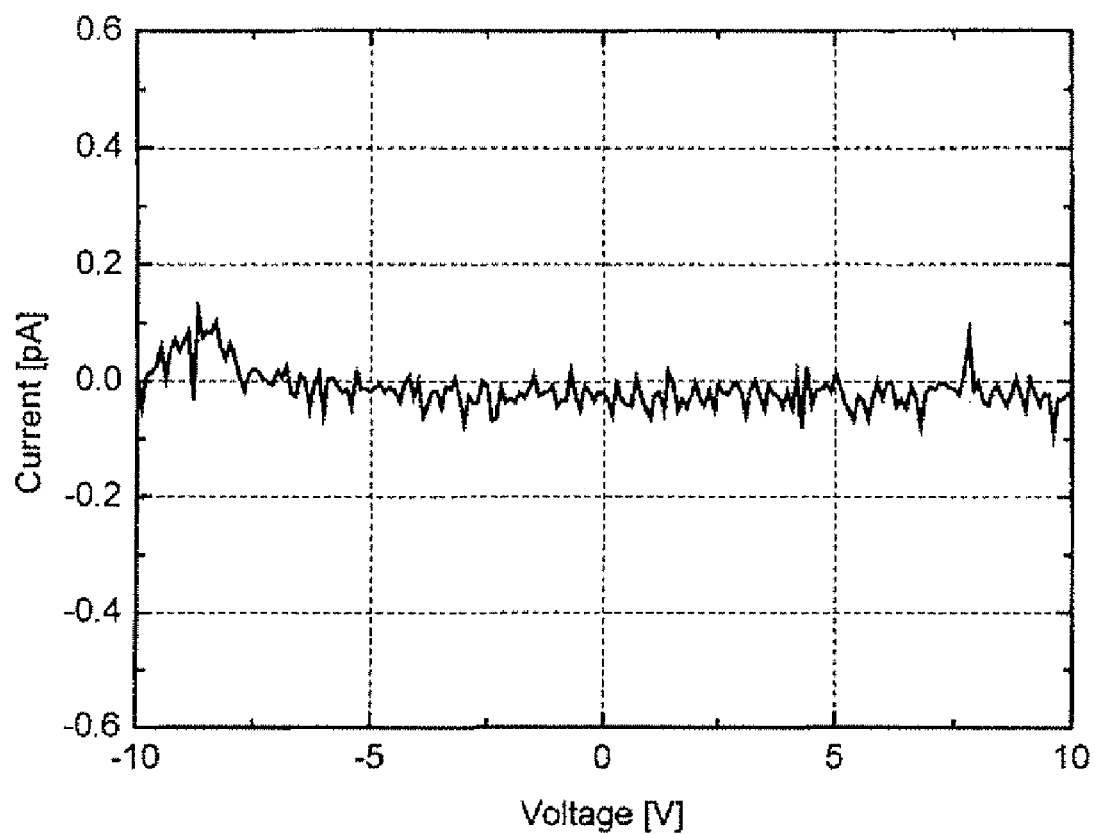
FIG. 23 is a graph showing the current profile of the diamond semiconductor device of Comparative Example 2.

The device was tested at room temperature according to a current-voltage test method in the same manner as in Example 6. The test result is shown in FIG. 23 as a graph. From the graph, it is known that the device could not have electric conductivity.

Industrial Applicability

The semiconductor device of the invention is a diamond-based power device, and has excellent characteristics as compared with conventional devices in point of low power loss, high-temperature workability and high-speed control, and is characterized in that the device package can be down-sized. As its application field, the device is usable for inverters for industrial motors, electric vehicles, etc.

In addition, the device is also usable as sensors for detecting high-energy charged particles, radiations such as X-rays, and UV rays; and owing to its excellent radiation resistance and workability with no cooling, the device can be used in small-sized maintenance-free facilities in severe environments. Its application field includes atomic furnaces, nuclear facilities, and also radiation measurement in space.

The surface treatment method to be used in the invention enhances the yield in production of the above-mentioned devices and improves the characteristics of these devices. The oxygen termination on the surface of diamond is the essential part of a production process for diamond-based devices; and the process of the invention that has enabled the formation of oxygen-terminated surface and/or non-terminated surface, not requiring heat treatment inevitable in conventional methods, gives a great latitude to the entire process of device production.

The invention claimed is:

1. A diamond semiconductor device comprising a pair of electrodes fixed on a diamond substrate, wherein at least one interface to the electrode on the surface of the diamond substrate has a hydrogen termination, and at least the surface of the substrate between the pair of two electrodes is so controlled as to have a larger electric resistivity value than inside the substrate thereby preventing the generation of leakage current in the substrate surface between the two electrodes.

2. The diamond semiconductor device as claimed in claim 1, wherein at least the substrate surface between the two electrodes is an oxygen-terminated surface.

3. The diamond semiconductor device as claimed in claim 1, wherein at least the substrate surface between the two electrodes is a non-termination surface.

* * * * *